United States Patent [19]

Laganza et al.

[11] Patent Number: 4,986,007
[45] Date of Patent: Jan. 22, 1991

[54] RETICLE FRAME ASSEMBLY

[75] Inventors: Joseph L. Laganza, East Norwalk; Orest Engelbrecht, Ridgefield, both of Conn.

[73] Assignee: SVG Lithography Systems, Inc., Wilton, Conn.

[21] Appl. No.: 30,009

[22] Filed: Mar. 25, 1987

[51] Int. Cl.$^5$ ............................................. B41B 11/00
[52] U.S. Cl. ....................................... 33/621; 33/645; 33/623
[58] Field of Search ................ 33/568, 613, 614, 615, 33/617, 621, 623, 645, 1 M; 269/60, 317, 319; 350/531

[56] References Cited

U.S. PATENT DOCUMENTS

| 1,912,547 | 6/1933 | Smith et al. | 33/615 |
| 2,689,411 | 9/1954 | Huck | 33/621 |
| 2,825,142 | 3/1958 | Johnson | 33/615 |
| 3,617,126 | 11/1971 | Gillespie | 33/615 |
| 3,626,600 | 12/1971 | Gaither | 33/568 |
| 3,950,095 | 4/1976 | Bouygues et al. | 33/568 |
| 4,408,830 | 10/1983 | Wutherich | 33/1 M |
| 4,575,942 | 3/1986 | Moriyama | 33/1 M |
| 4,667,415 | 5/1987 | Barsky | 33/568 |

Primary Examiner—Harry N. Haroian
Attorney, Agent, or Firm—Paul A. Fattibene

[57] ABSTRACT

A reticle frame for precisely holding a reticle or mask used in photolithography with a minimum of distortion. A plurality of adjusting screws are used to accurately position the reticle within the frame. Transversely compliant axial loading springs opposing the adjusting screws reduce the bending forces acting on the reticle. Precision balls are used to establish a plane for the reticle further reducing bending forces thereon causing less distortion and thereby proving greater resolution when the reticle image is reproduced on a semiconductor wafer.

9 Claims, 2 Drawing Sheets

RETICLE FRAME ASSEMBLY

FIELD OF THE INVENTION

This invention relates generally to a reticle frame for use in the fabrication of integrated circuits, and more particularly to a reticle frame that reduces distortion of the reticle mask.

BACKGROUND OF THE INVENTION

In the fabrication of integrated circuits, photolithographic and projection printing techniques are used. A reticle or mask is used to transfer a desired image onto the silicon wafer. In the past the mask or reticle has been held with reticle frames to facilitate alignment and handling. The prior art reticle frames consists of rectangular frames having lapped pads spaced around the periphery. The lapped pads act as a reference point to establish a flat plane for holding the reticle. Three pads re typically used to define a single plane. Although the pads accurately define a reference plane they introduce undesirable stresses in the reticle which cause distortions.

The transverse positioning of the reticle within the plane established by the reticle frame and pads is necessary. In the prior art the two transverse adjustments are accomplished by a number of adjusting screws extending through the periphery of the frame. If the pads positioned along the periphery of the rectangular frame are considered to establish a plane perpendicular to the Z axis in a rectangular coordinate system then the adjusting screws would adjust the reticle along the X and Y axes relative to the frame. On the side of the reticle frame opposite the adjusting screws the transverse motions of the reticle are compensated for by plungers extending through the reticle frame. The plungers consist of rigid metal sleeves having spring loaded tips. While the adjusting screws and plungers provide accurate aligning of the reticle within the frame, undesirable bending moments and stresses develop in the reticle. This results in the reticle becoming slightly distorted. These distortions reduce the image quality reproducable on the silicon wafer. While the prior art devices perform adequately for most integrated circuit fabrication, the continuing quest for reduced size and higher density integrated circuits requiring much greater resolutions necessitated a new and innovated approach to the holding and aligning of a reticle.

SUMMARY OF THE INVENTION

The present invention is directed to a new and improved reticle frame. The present invention is characterized by a rectangular reticle frame including means for establishing a plane for the mounting of a reticle with reduced stresses thereon and means for adjusting the position of the reticle within the frame in the two directions transverse to the plane formed by the reticle frame having transversely compliant means for transmitting only axial forces to the reticle whereby bending moments are reduced resulting in a minimum of distortion in the reticle.

Accordingly, it is an object of the present invention to provide a mounted reticle having a flatter surface.

It is yet another objective of the present invention to provide a reticle frame that improves resolution in semiconductor devices.

It is an advantage of the present invention that the reticle frame reduces stresses on the reticle.

It is yet another advantage of the present invention that the reticle frame produces less distortion in the reticle.

It is a feature of the present invention that precision balls are used to establish a plane.

It is yet another feature of the present invention that transversely compliant springs are used to transmit axial loads to the reticle.

These and other objects, advantages, and features will become readily apparent in view of the following more detailed description.

DETAILED DESCRIPTION OF THE PREFERRED EMBODIMENT

Figure 1:
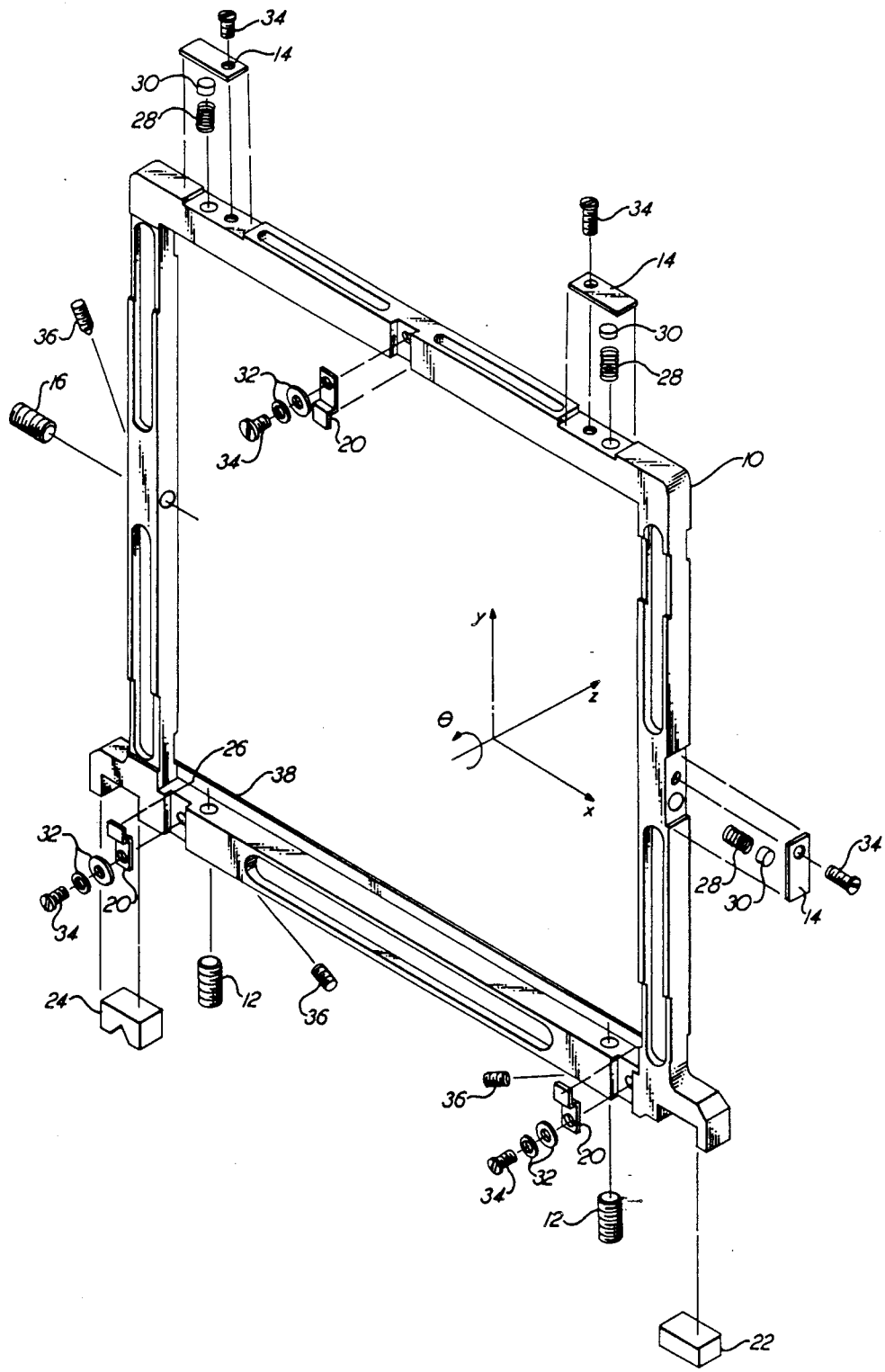
FIG. 1 is an exploded perspective view of the invention.

In FIG. 1 the reticle frame of the present invention is shown. The reticle frame comprises a rectangular frame 10 having four sides. Along two adjacent sides of frame 10 are mounted adjusting screws 12 and adjusting screw 16. The two adjusting screws 12 position the reticle, when placed within frame 10, along the Y-axis with reference to the rectangular coordinate system shown in FIG. 1. The two screws 12 extend through a side of frame 10 to contact a rectangular reticle (not shown) placed within frame 10. By adjusting each of the screws 12, the reticle can be adjusted along the Y-axis as well as rotated about the Z-axis to adjust for the angle θ. Screws 12 can be locked into position with locking screws 36. Locking screws 36 enter the side of frame 10 at an angle to contact screws 12 preventing any movement once the reticle is positioned. On an adjacent side of frame 10 another adjusting screw 16 is mounted. Adjusting screw 16 extends through the side of frame 10 to contact the reticle therein and positions the reticle along the X-axis. Adjusting screw 16 can also be locked into position by locking screw 36. Within the sides opposing adjusting screws 12 and 16 are mounted transversely compliant springs 28. Springs 28 extend through frame 10 and are held in position by spacers 30 and plates 14 attached to the frame 10 by screws 34. When positioned, springs 28 extend beyond the edges of frame 10 so as to contact the reticle when in position. Springs 28 are transversely compliant and primarily transmit an axial force along their longitudinal axis. Springs 28 can move freely in a lateral direction with respect to their longitudinal axis. This transmission of only an axial force on the reticle helps reduce bending moments resulting in less distortion within the reticle. The reticle is held in the frame by lips 38. A lip 38 is placed on each of two opposing sides of frame 10. One surface of the reticle is held in position by lips 38 and the other surface of the reticle is held in position by three spring clips 20. Spring clips 20 are mounted on the sides of frame 10 by screws 34. Washers 32 are placed between clips 20 and screws 34 to provide a better connection. Along the bottom portion of frame 10 on one of the sides reference blocks 22 and 24 are placed on each end. On one end a V-block 24 is placed and on the other a flat block 22 is placed. These blocks act as a reference point for alignment of the reticle within frame 10.

Figure 2:
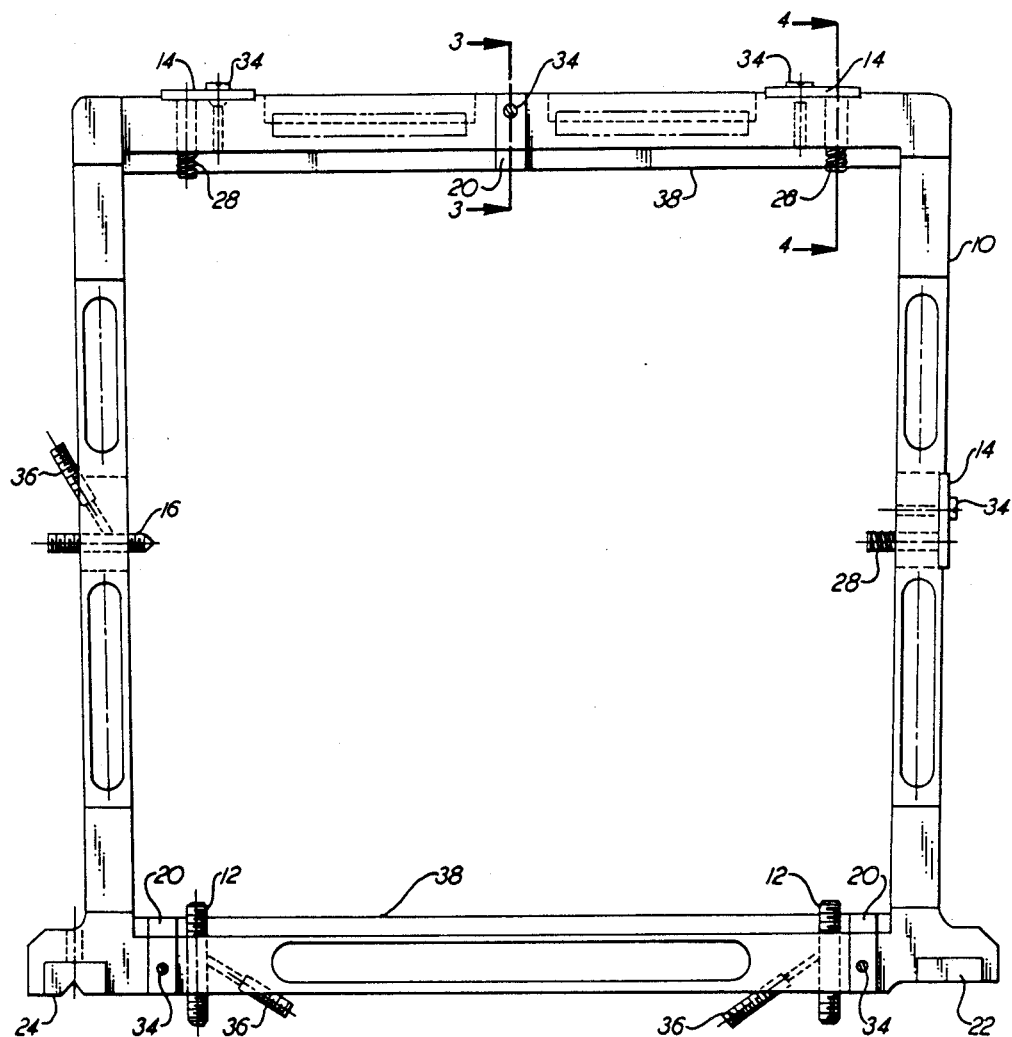
FIG. 2 is a front elevational view of the invention.

In FIG. 2 the two lips 38 on opposing sides of frame 10 can more easily be seen. Behind each clip 20 on lip 38 is mounted a precision ball. The precision balls mounted three points on lip 38 define a plane. The reticle when mounted is held in position by lips 38 and spring clips 20. The spring clips 20 apply sufficient pressure on the reticle to avoid rattling of the reticle. The spring clips should not apply so much force that distortion occurs. Each spring clip 20 also has a precision ball mounted thereon. Adjusting screws 12 are positioned on the lower or bottom portion of frame 10 so as to bear the weight of the reticle frame. This is advantageous in that the transversely compliant springs 28 will not have to bear the weight of the reticle. This makes possible the use of a lighter spring reducing the likelihood of forces transverse to the springs axis from being transmitted to the reticle.

Figure 3:
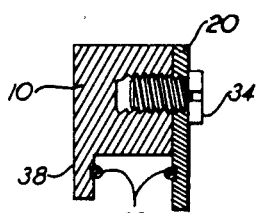
FIG. 3 is a cross-section taken along line 3—3 in FIG. 2.

In FIG. 3 the lip 38 and precision balls 26 are easily seen. Clip 20 can be straight as shown in FIG. 3 or angled as shown in FIG. 1 depending on the thickness of the reticle used. The precision balls 26 on lip 38 and clip 20 help reduce bending forces and stresses on the reticle.

Figure 4:
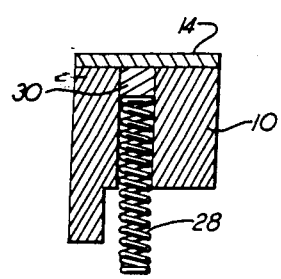
FIG. 4 is a cross-section taken along line 4—4 in FIG. 2.

In FIG. 4 the transversely compliant spring 28 is illustrated. The transversely compliant spring 28 has little resistance to movement traverse to its longitudinal axis. Therefore, the reticle, when being positioned, is free to move laterally reducing the bending stresses thereon resulting in less distortion. It shall be understood that while a helical spring is illustrated, the term spring applies to other types of springs including any elastic body or device that recovers to its original or nearly original shape when released after being distorted.

Although the preferred embodiment has been illustrated and described, it will be obvious to those skilled in the art that various modifications may be made without departing from the spirit and scope of the invention.

What is claimed is:

1. A reticle frame for precisely positioning and holding a reticle in the X, Y and Z axis with a minimum of bending comprising:
    a frame;
    Z-axis alignment means, mounted on said frame, for positioning the reticle along the Z-axis;
    Y-axis adjusting means, mounted on said frame, for adjustably positioning the reticle along the Y-axis;
    a Y-axis axial loading spring, mounted on said frame opposite said Y-axis adjusting means, said Y-axis axial loading spring being transversely compliant when said reticle frame is holding said reticle thereby preventing distortion of said reticle;
    X-axis adjusting means, mounted on said frame, for adjustably positioning the reticle along the X-axis;
    a X-axis axial loading spring, mounted on said frame opposite said X-axis adjusting means, said X-axis axial loading spring being transversely compliant when said reticle frame is holding said reticle thereby preventing distortion of said reticle; and
    reference means, attached to said frame, for referencing said frame with respect to an alignment fixture.

2. A reticle frame as in claim 1 wherein:
    said Y-axis spring and said X-axis spring are helical springs.

3. A reticle frame as in claim 1 further comprising:
    means for securing said Y-axis and X-axis adjusting means.

4. A reticle frame as in claim 1 wherein said Y axis adjusting means comprises:
    a pair of adjusting screws extending through said frame.

5. A reticle frame as in claim 4 wherein:
    said pair of adjusting screws are positioned on the bottom portion of said frame so that the weight of the reticle rest thereon.

6. A reticle frame as in claim 5 wherein said X-axis adjusting means comprises:
    at least one adjusting screw extending through said frame.

7. A reticle frame for precisely positioning and holding a reticle in the X, Y and Z axis with a minimum of bending comprising:
    a frame;
    a Z-axis reference lip protruding from said frame;
    a plurality of precision balls mounted on said reference lip;
    a plurality of clips spaced about the periphery of said frame each having a precision ball mounted thereon; and
    means for adjustably attaching said plurality of clips to said frame whereby the reticle is held in position adjacent said frame;
    X-axis adjusting means, mounted on said frame, for adjustably positioning the reticle along the X-axis;
    a Y-axis transversely compliant axial loading spring, mounted on said frame opposite said Y-axis adjusting means;
    X-axis adjusting means, mounted on said frame, for adjustable positioning the reticle along the X-axis;
    a X-axis transversely compliant axial loading spring, mounted on said frame opposite said X-axis adjusting means; and
    reference means, attached to said frame, for referencing said frame with respect to an alignment fixture.

8. A reticle frame for precisely positioning and holding a reticle in the X, Y and Z axis with a minimum of bending comprising:
    a frame;
    Z-axis alignment means, mounted on said frame, for positioning the reticle along the Z-axis;
    Y-axis adjusting means, mounted on said frame, for adjustably positioning the reticle along the Y-axis;
    a Y-axis transversely compliant axial loading spring, mounted on said frame opposite said Y-axis adjusting means;
    X-axis adjusting means, mounted on said frame, for adjustably positioning the reticle along the X-axis;
    a X-axis transversely compliant axial loading spring, mounted on said frame opposite said X-axis adjusting means;
    a flat block mounted on said frame; and
    a V-block mounted on said frame.

9. A reticle frame for precisely positioning and holding a reticle in the X, Y, and Z axis with a minimum of bending comprising:
    a base;
    a first lip on the edge of said base;
    a first side attached perpendicularly to said base on one end thereof;
    a second side attached perpendicularly to said base on the other end thereof opposite said first side;
    a top connected between the free ends of said first and second sides opposite said base;

a second lip on the edge of said top facing said first lip;

two precision balls mounted on one of said first or second lips;

one precision ball mounted on the other of said first or second lips, said two and one precision balls establishing a plane;

three spring clips each having a precision ball mounted thereon attached to said base and top opposite said two and one precision balls;

an X-axis adjusting screw extending through one of said first or second sides;

an X-axis transversely compliant axial loading spring extending through the other of said first or second sides opposite said X-axis adjusting screw;

two Y-axis adjusting screws extending through said base;

at least one Y-axis transversely compliant axial loading spring extending through said top;

a flat block mounted on one end of said base; and a V-block mounted on the other end of said base.

* * * * *